(12) United States Patent
Blackwell et al.

(10) Patent No.: US 11,137,681 B2
(45) Date of Patent: Oct. 5, 2021

(54) LINED PHOTOBUCKET STRUCTURE FOR BACK END OF LINE (BEOL) INTERCONNECT FORMATION

(71) Applicant: Intel Corporation, Santa Clara, CA (US)

(72) Inventors: James M. Blackwell, Portland, OR (US); Robert L. Bristol, Portland, OR (US); Marie Krysak, Portland, OR (US); Florian Gstrein, Portland, OR (US); Eungnak Han, Portland, OR (US); Kevin L. Lin, Beaverton, OR (US); Rami Hourani, Portland, OR (US); Shane M. Harlson, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 247 days.

(21) Appl. No.: 16/097,960

(22) PCT Filed: Jul. 1, 2016

(86) PCT No.: PCT/US2016/040876
§ 371 (c)(1),
(2) Date: Oct. 31, 2018

(87) PCT Pub. No.: WO2018/004699
PCT Pub. Date: Jan. 4, 2018

(65) Prior Publication Data
US 2019/0146335 A1 May 16, 2019

(51) Int. Cl.
*G03F 7/00* (2006.01)
*G03F 7/40* (2006.01)
(Continued)

(52) U.S. Cl.
CPC .......... *G03F 7/0035* (2013.01); *G03F 7/0002* (2013.01); *G03F 7/40* (2013.01);
(Continued)

(58) Field of Classification Search
None
See application file for complete search history.

(56) References Cited

U.S. PATENT DOCUMENTS

2003/0044725 A1 3/2003 Hsue et al.
2004/0002217 A1 1/2004 Mazur et al.
(Continued)

OTHER PUBLICATIONS

International Search Report and Written Opinion for International Patent Application No. PCT/US2016/040876 dated Apr. 27, 2017, 12 pgs.
(Continued)

*Primary Examiner* — Kathleen Duda
(74) *Attorney, Agent, or Firm* — Schwabe, Williamson & Wyatt, P.C.

(57) ABSTRACT

Lined photoresist structures to facilitate fabricating back end of line (BEOL) interconnects are described. In an embodiment, a hard mask has recesses formed therein, wherein liner structures are variously disposed each on a sidewall of a respective recess. Photobuckets comprising photoresist material are also variously disposed in the recesses. The liner structures variously serve as marginal buffers to mitigate possible effects of misalignment in the exposure of photoresist material to photons or an electron beam. In another embodiment, a recess has disposed therein a liner structure and a photobucket that are both formed by self-assembly of a photoresist-based block-copolymer.

19 Claims, 15 Drawing Sheets

(51) Int. Cl.
  *H01L 21/027* (2006.01)
  *H01L 21/768* (2006.01)
(52) U.S. Cl.
  CPC ........ *H01L 21/027* (2013.01); *H01L 21/0274* (2013.01); *H01L 21/768* (2013.01); *H01L 21/76802* (2013.01)

(56) References Cited

U.S. PATENT DOCUMENTS

2015/0171009 A1   6/2015  Bristol et al.
2015/0179513 A1   6/2015  Myers et al.
2016/0104642 A1   4/2016  Bristol et al.
2018/0294167 A1*  10/2018 Bristol .............. H01L 21/76897

OTHER PUBLICATIONS

International Preliminary Report on Patentability for International Patent Application No. PCT/US2016/040876 dated Jan. 10, 2019, 9 pgs.

* cited by examiner

LINED PHOTOBUCKET STRUCTURE FOR BACK END OF LINE (BEOL) INTERCONNECT FORMATION

CROSS-REFERENCE TO RELATED APPLICATION

This patent application is a U.S. National Phase Application under 35 U.S.C. § 371 of International Application No. PCT/US2016/040876, filed Jul. 1, 2016, entitled "LINED PHOTOBUCKET STRUCTURE FOR BACK END OF LINE (BEOL) INTERCONNECT FORMATION," which designates the United States of America, the entire disclosure of which is hereby incorporated by reference in its entirety and for all purposes.

BACKGROUND

1. Technical Field

Embodiments described herein variously relate to semiconductor structures and processing and more particularly to the use of liner structures in fabricating back end of line (BEOL) interconnects.

2. Background Art

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Lined photobucket structures for use in fabricating back end of line (BEOL) interconnects are described herein. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to the formation of a liner at a sidewall of a photobucket structure, wherein the liner structure is relatively more tolerant of one or more operations of a subtractive process, as compared to a resist material of the photobucket structure. Applications may be directed toward one or more of extreme ultra-violet (EUV) lithography, general lithography applications, solutions for overlay issues, and general photoresist technologies. In an embodiment, materials are described that are suitable for improving performance of so-called "photobucket" based approaches. In such an approach, a resist material is confined to a pre-patterned hardmask. Select ones of the photobuckets are then removed using a high-resolution lithography tool, e.g., an EUV lithography tool. Specific embodiments may be implemented to improve tolerance of errors in the patterning and/or alignment of a mask structure that is to be disposed above one or more photobuckets.

Figure 1:
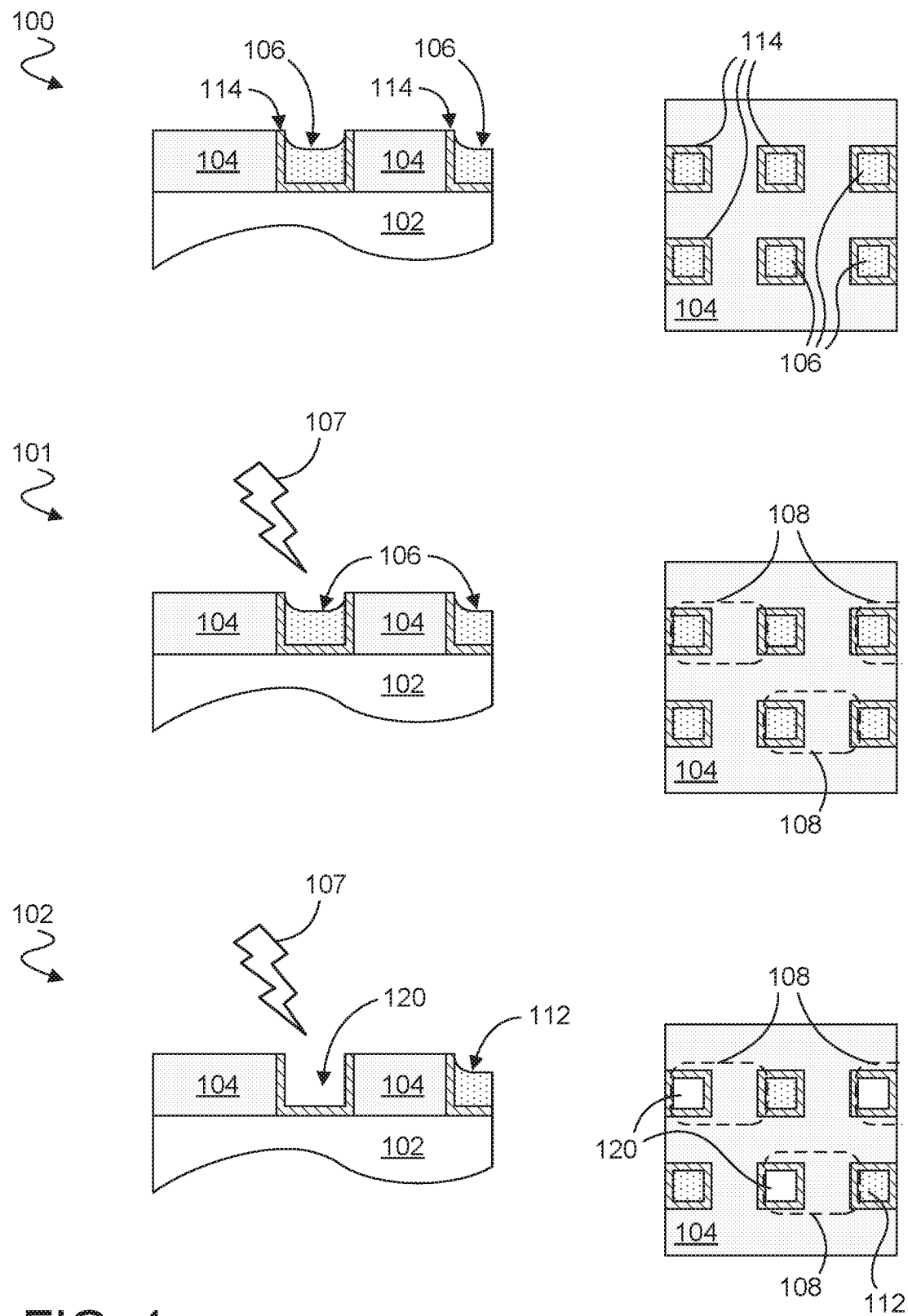
FIG. 1 illustrates cross-sectional views and corresponding plan views of various operations in a method of patterning using lined resist photobucket structures in accordance with an embodiment.

To exemplify one or more of the concepts involved herein, FIG. 1 illustrates cross-sectional views and corresponding plan views of various stages 100-102 during a method of patterning using lined photobucket structures, in accordance with an embodiment.

Referring to stage 100, a pre-patterned hardmask 104 is disposed above a substrate 102. The pre-patterned hardmask 104 has openings formed by respective sidewalls having liner structures 114 variously disposed thereon. The openings further have variously disposed therein a photoresist 106. The photoresist 106 is confined to the openings by the liner structures 114 variously extending in the pre-patterned hardmask 104, e.g., to provide a grid of potential via locations.

Referring to stage 101, select ones of the photobuckets are subjected to an exposure 107 from a lithography tool. The photoresist 106 is exposed with a lithography tool, e.g., an EUV lithography tool, to select which vias to open. In an embodiment, alignment between the lithography tool and the pre-patterned hardmask 104 grid is imperfect resulting in an asymmetry of exposure in the target bucket and/or partial exposure in the neighboring bucket. As seen in the plan view, the exposure 107 is a displaced aerial image 108.

Referring to stage 102, the exposure 107 of stage 101 may have involved mis-alignment and partial exposure of non-selected openings in pre-patterned hardmask 104. However, the presence of liner structures 114 at the edges of such openings (in combination with physical and/or chemical properties of the liner structures 114) may contribute to some embodiments providing improved tolerance for such mis-alignment and partial exposure. As a result, only the selected photobuckets are cleared to form openings 120, leaving unselected photobuckets as closed photobuckets 112. Subsequent processing (not shown) may remove those liner structures 114 which are disposed in openings 120.

In one embodiment, the process used increases the likelihood that only select photobuckets are ultimately opened, following exposure 107 of select regions of the photoresist 106. Such embodiments may mitigate the effect of unintentional exposure of non-select photobuckets, where any such unintentional exposure is more likely to be limited to liner structures of such non-select photobuckets—e.g., reducing the chance of a mask material in the photobucket being unintentionally exposed. Examples of such processes are elaborated below in association with FIGS. 4A, 4B and FIGS. 5A, 5B. As a result, the select locations which receive a greater exposure are ultimately cleared to provide open photobucket locations 120 following development. The non-selected locations which receive no exposure, or only partial exposure but to a lesser extent in the case of mis-alignment, remain as closed photobucket locations 112 following development.

Figure 2:
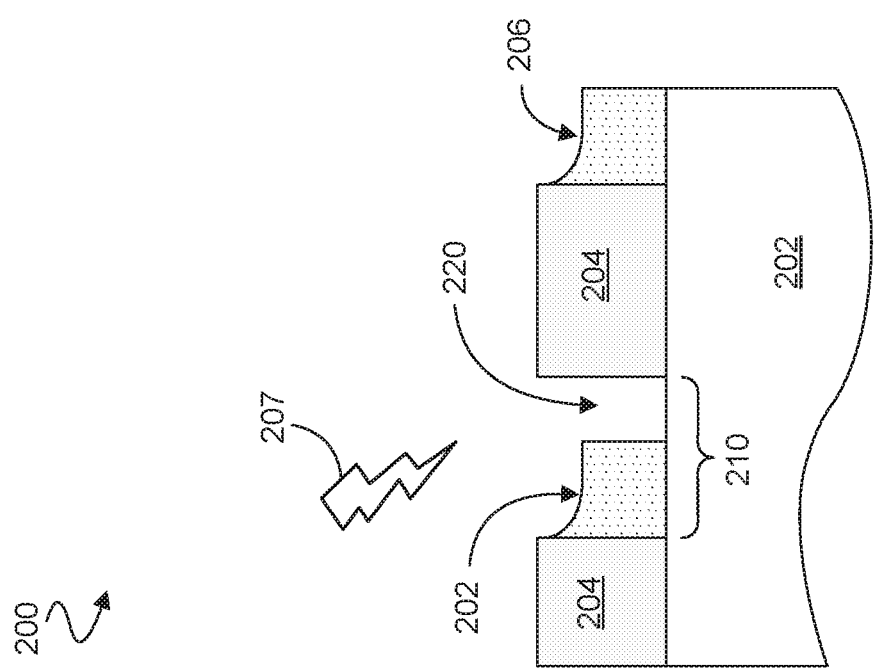
FIG. 2 illustrates a cross-sectional view of a conventional resist photobucket structure following photobucket development after a mis-aligned exposure.

To exemplify a contrasting scenario where conventional (non-lined) photobucket structures are used, FIG. 2 illustrates a cross-sectional view of pre-patterned hardmask 204 having formed therein a conventional resist photobucket structure. Following photobucket development after a misaligned exposure 207, a photobucket region 210 is only partially cleared 220, with some residual photoresist 202 remaining. The photoresist 206 of an adjoining photobucket remains after exposure 207. In the case that the photobucket 210 is a selected photobucket, the misaligned exposure 207 only partially clears the photobucket, which may lead to subsequent poor quality fabrication of conductive structure in such locations. In the case that the photobucket 210 is a non-selected photobucket, some unwanted opening 220 occurs, potentially leading to subsequent formation of conductive structures in unwanted locations.

Figure 3:
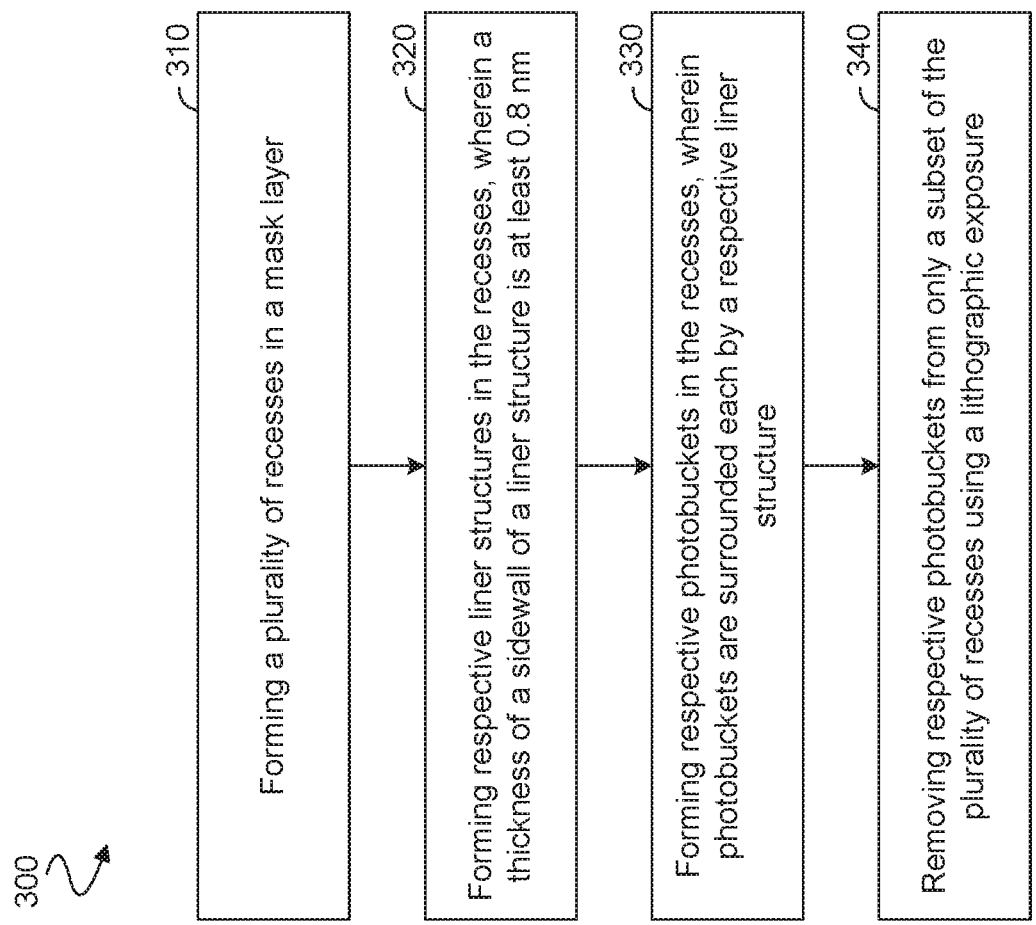
FIG. 3 is a flow diagram illustrating features of a method to fabricate lined resist photobucket structures according to an embodiment.

FIG. 3 illustrates features of a method 300 to provide patterned photoresist structures according to an embodiment. Method 300 may include processing such as that represented by stages 100-102, for example. In an embodiment, method 300 includes, at 310, forming a plurality of recesses in a mask layer e.g., to form some or all structures of hardmask 104. The mask layer may be disposed on an interlayer dielectric material layer such as substrate 102. Such an interlayer dielectric material layer may subsequently have interconnects formed therein by processing which is part of, or subsequent to, method 300.

The processing at 310 may include forming any of a variety of recessed square, circular, elliptical, trench or other shapes (by lithographic etch, for example). By way of illustration and not limitation, some or all such recesses may each be at least 5 nm wide and/or extend at least 20 nm deep into (e.g., through) the mask layer in a direction toward an underlying IDL layer. In one embodiment, the processing at 310 includes forming an array of recesses having (for example) respective widths each in a range of 8 nm to 20 nm, and respective depths each in a range of 50 nm to 100 nm. Recesses of such an array may have a pitch between 15 nm and 50 nm. However, these dimensions are merely illustrative of one example embodiment, and may vary according to implementation-specific details.

Method 300 may further comprise, at 320, forming a respective liner structure in each of the plurality of recesses. For a given recess, a liner structure formed therein may include a material that is relatively tolerant of an exposure process, a bake process or a development process e.g., as compared to a corresponding tolerance of a photoresist material that is to be disposed in that liner structure. However, the liner structure may nevertheless be susceptible to removal by additional or alternative processing e g., beyond processing which is sufficient to remove an adjoining photoresist material.

A liner structure formed at 320 may comprise a conformal film including, for example, a metal oxide and/or a metal nitride. Some examples of such metal oxides and/or metal nitrides include, but are not limited to, aluminum oxide, silicon oxide, tin oxide, hafnium oxide, zirconium oxide and titanium nitride and silicon nitride. A liner material may be deposited at 320 by atomic layer deposition (ALD), polymer grafting, molecular layer deposition (MLD), on-surface polymerization and/or other such processing to form liner structures that are strongly adhered to respective sidewalls and horizontal surfaces of the mask layer. In some embodiments, the liner material includes an organic material or hybrid organic/inorganic material. For example, liner structures may be formed at 320 by self-assembly using a polymer that, for example, is also configured to form some or all of a photobucket. A liner structure may also be formed through deposition of organometallic precursor where both organic components and metallic components remain therein.

For some or all of the liner structures formed at 320, a respective thickness of a sidewall of each such liner structure may be at least a minimum distance—in one embodiment, 0.8 nanometers (nm)—that, for example, is associated with a possible (e.g., maximum tolerable) amount of process misalignment. For example, a liner sidewall may have a thickness of at least 1.0 nm (e.g., at least 1.5 nm, in some embodiments). Alternatively or in addition, the thickness of a liner may be limited, for example, by a minimum required volume of a photobucket. For example, the thickness may be in a range of 0.8 nm to 2.5 nm—e.g., in a range of 1.0 nm to 2.5 nm. In some preferred embodiments, a sidewall of a liner has a thickness that is in a range of 1.5 nm to 2.5 nm (e.g., in a range of 1.5 nm to 2.0 nm). A thickness of a liner may have a particular relationship to one or more dimensions of a photobucket that is eventually to be disposed in that liner, as described further herein.

For each of the plurality of recesses, method 300 may further perform, at 330, forming a respective photobucket in the recess, wherein the photobucket is surrounded (in at least one plane, for example) by the liner structure in the recess. The forming at 330 may include spin coating photoresist material into respective recesses of the mask layer. The photobuckets formed at 330 may include, for example, any of a variety of photoresist materials adapted from conventional techniques for fabricating back end of line interconnects.

In some embodiments, the forming at 320 and 330 includes performing self-assembly of monolayers. For example, a self-assembled monolayer (SAM) may be formed from organic molecules, each having respective end groups that are differently reactive. A given one of such organic molecules may include a tail group (or "domain") and a head group/domain having opposite respective reactivities or other properties. A first domain may be configured to segregate and/or bond toward a sidewall of a mask layer sidewall structure, where a second domain is configured to instead segregate away from such a sidewall structure (toward a center of the recess). Examples of such molecules include alkoxy- and aminosilanes comprising an amine, phosphine, thiol, pyridyl, aromatic or other such head group. A typical molecule is 3-aminopropyltriethoxysilane, but any of a variety of other suitable molecules be used, in different embodiments.

In some embodiments, a liner structure formed at 320 has at least some minimal thickness relative to a corresponding thickness (or other dimension) of a photoboucket that is disposed in that liner structure. For example, a thickness of a first liner structure may be at least 5% (e.g., 10% or more) of the thickness of a first photobucket adjoining the first liner structure. In some embodiments, the thickness of a liner structure is at least 15% (for example, 20% or more) of the thickness of a photobucket disposed in that liner structure.

Although some embodiments are not limited in this regard, method 300 may further comprise one or more operations to facilitate the deposition of one or more interconnects using some or all of the photobuckets formed at 330. By way of illustration and not limitation, method 300 may further include, at 340, removing respective photobuckets from only a subset of the plurality of recesses. The removing at 340 may include lithographic exposure of one or more photobuckets to photons (e.g., EUV) or an electron beam. Additional processing of the exposed photobuckets may be subsequently performed to remove photoresist material (and in some embodiment, to also remove liner material) from the corresponding recesses. Such additional processing may include developing e.g., with tetramethylammonium hydroxide (TMAH) to remove photoresist—followed by baking and/or wet etching with a dilute acid (or a base, as appropriate to the type of liner material being removed).

In some embodiments, the removing at 340 includes removing a photoresist material independent of any chemical reaction of the photoresist material with an adjoining liner material. For example, the liner material may be devoid of any quencher or other compound that is to react with a photoresist or byproduct thereof. In another embodiment, a liner material may react with a component from a photoresist material to facilitate removal of the liner material—e.g., where removal of the photoresist material is independent of any such chemical reaction at the liner material.

For example, a photobucket may provide an acid component—e.g., wherein the acid component is formed or otherwise released in response to an exposure of the photobucket to photons (or an electron beam), in response to a thermal baking process or the like. Such an acid component may react with a solubility component of the liner material to facilitate development of at least an adjoining portion of such liner material. Such development may be only indirectly result from photons (or electron) exposure and/or from thermal baking—i.e., where the development relies on the acid component as an intermediate mechanism. The developed portion of the liner material may then be selectively removed by a subsequent dry etching and/or other suitable subtractive process.

Figure 4A:
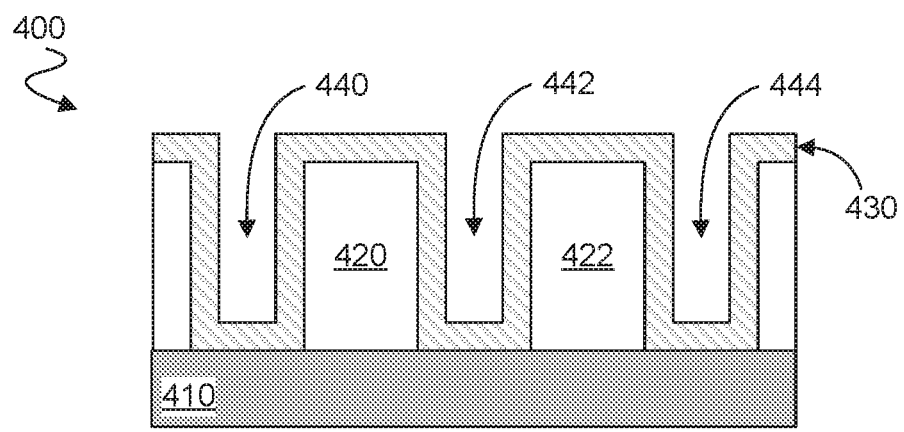
FIGS. 4A, 4B illustrate cross-sectional views of various operations in a method of patterning using lined resist photobucket structures in accordance with an embodiment.
Figure 4A:
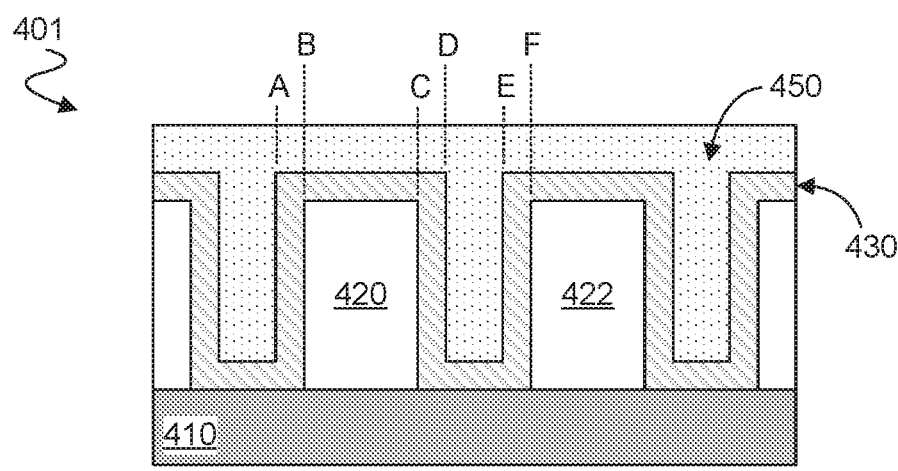
Figure 4A:
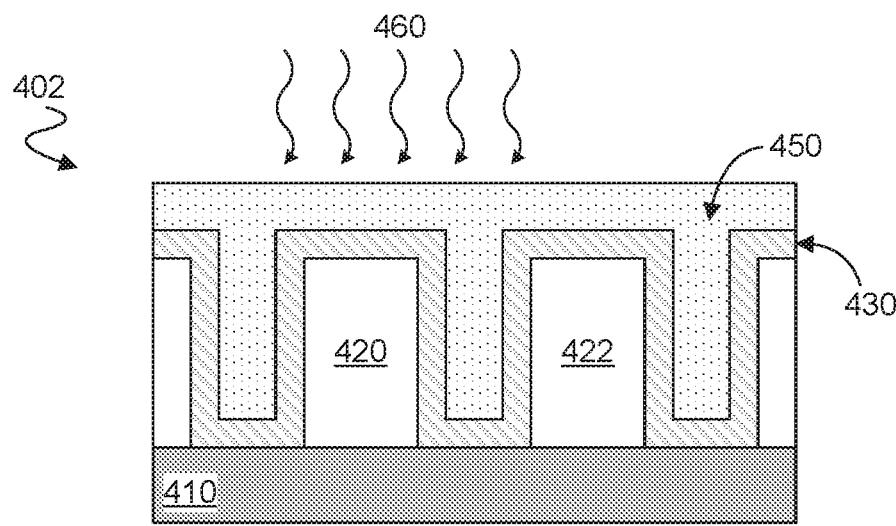
Figure 4B:
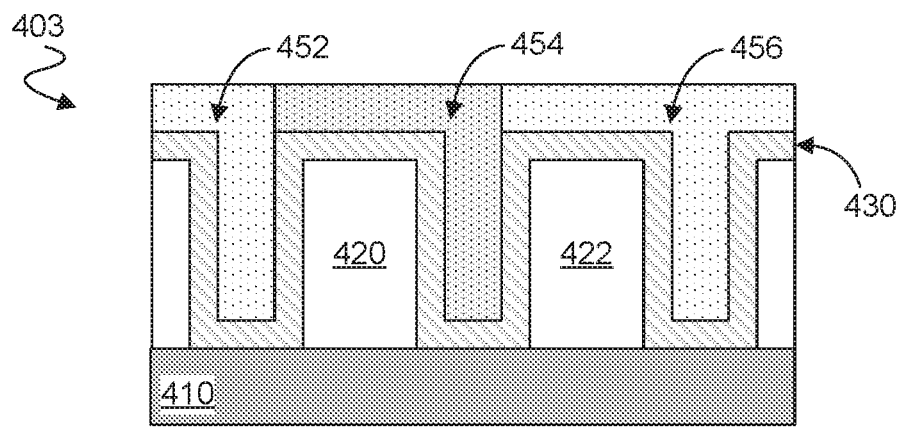
Figure 4B:
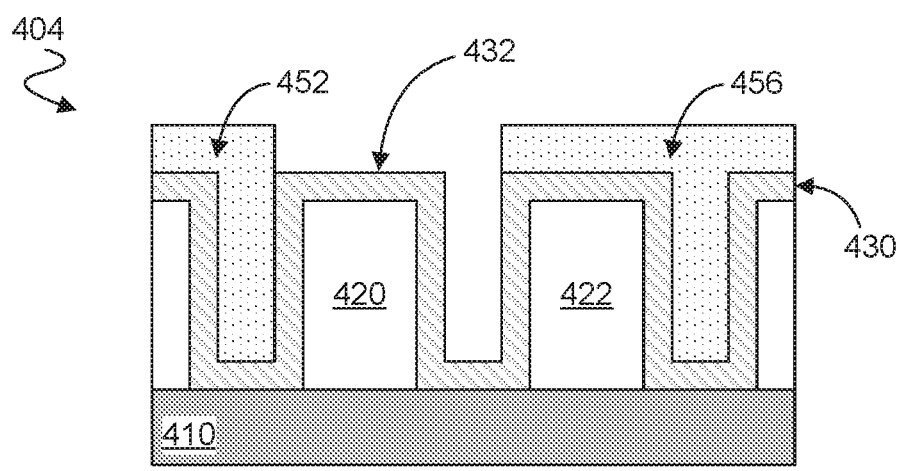
Figure 4B:
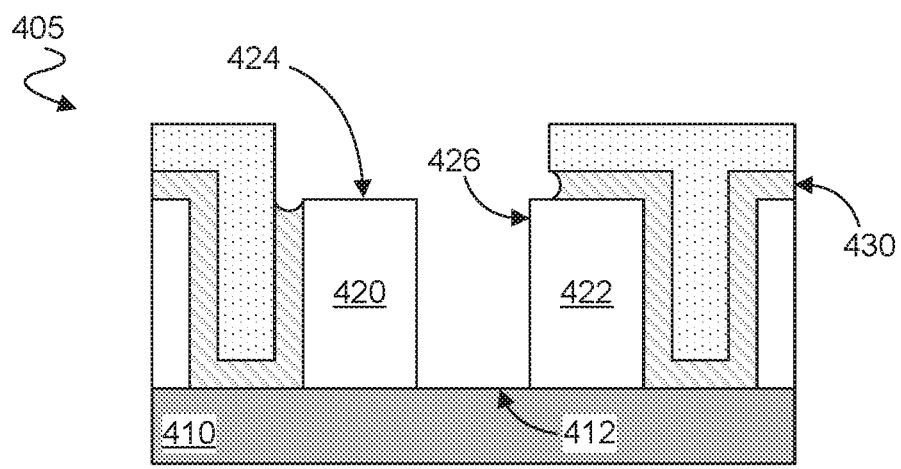

FIGS. 4A and 4B illustrate stages 400-405 of processing to provide patterned photoresist structures according to an embodiment. Processing such as that represented by stages 400-405 may include some or all of the processing represented by stages 100-102, for example. In some embodiments, the processing represented by stages 400-405 is according to method 300. Referring to stage 400, a pre-patterned hard mask is disposed on a substrate 410. The pre-patterned hard mask has formed therein recesses (such as the illustrative recesses 440, 442, 444) that extend through to substrate 410. Structures 420, 422 of the hard mask variously define at least in part respective sidewalls of recesses 440, 442, 444. In an embodiment, liner structures are variously formed on such sidewalls. By way of illustration and not limitation, a layer 430 of a liner material may extend over sidewall portions of structures 420, 422. Although some embodiments are not limited in this regard, layer 430 may further extend on a top side of the hard mask and/or on surface portions of substrate 410 which form the respective bottoms of recesses 440, 442, 444.

Stage 401 shows structures of stage 400 after a photoresist material 450 is spin coated or otherwise deposited over the hard mask—e.g., wherein portions of photoresist material 450 variously extend into recesses 440, 442, 444 to form respective photobuckets therein. Referring again to stage 401, the vertical lines A-F shown variously delineate the respective horizontal extents of a first liner portion, a second liner portion and a third liner portion of layer 430. The first liner portion separates a first photobucket in recess 440 from a sidewall of structure 420. The second liner portion separates a second photobucket in recess 442 from another sidewall of structure 420, wherein the third liner portion separates the second photobucket from a sidewall of structure 422. In such an embodiment, a thickness of a sidewall liner structure and a thickness of an adjoining photobucket may both be measured along the horizontal (i.e., orthogonally to lines A-F).

Subsequently, one or more such photobuckets—e.g., only a subset thereof—may be selectively subjected to subtractive processing which includes an exposure to photons or an electron beam. Structures of layer 430 may variously serve as marginal buffers to mitigate the effects of possible misalignment in the application of this selective exposure. By way of illustration and not limitation, subtractive processing may be performed to remove the second photobucket from recess 442—e.g., wherein one or both of the respective photobuckets in recesses 440, 444 are to be selectively protected from such subtractive processing.

Referring to stage 402, UV light 460 may be directed onto selective areas of photoresist material 450 as part of processing to remove the second photobucket. In practice, misalignment may result in UV light 460 being offset, along a given line of direction, from a desired position—e.g., wherein such offset is toward a plane including vertical line A and away from the plane including vertical line F. The liner portions variously disposed at the sidewalls of structures 420, 422 may provide protection for at least some minimal amount of such offset. For example, the first liner portion—between vertical lines A and B—may protect the photobucket in recess 440 from at least an offset of UV light 460 that is less than (or equal to) a horizontal distance between line A and line B.

Stage 403 shows structures of stage 402 after application of UV light 460 has resulted in an exposed portion 454 and unexposed portions 452, 456 of photoresist material 450. In the illustrative embodiment shown, the first liner portion between vertical lines A, B has at least partially protected the first photobucket (in recess 440) from a misalignment of UV light 460. In such a scenario, layer 430 may nevertheless allow all of the second photobucket (in recess 422) to be exposed to UV light 460.

Referring to stage 404, subsequent processing—e.g., including TMAH development and wet etching—may be performed to remove portion 454 and to expose a surface portion 432 of layer 430 that extends into recess 442. Referring to stage 405, exposed liner structures in recess 442 may then be removed—e.g., with a plasma etch, application of an etchant different other than that used to remove exposed portion 454 or further application of the same wet etching used to remove the exposed portion 454. In an embodiment, such removal may expose one or more hard mask surfaces such as a surface 424 of structure 420 and a surface 426 of structure 422. A surface 412 of substrate 410 may also be exposed to facilitate subsequent processing to form an interconnect structure therein.

Figure 5A:
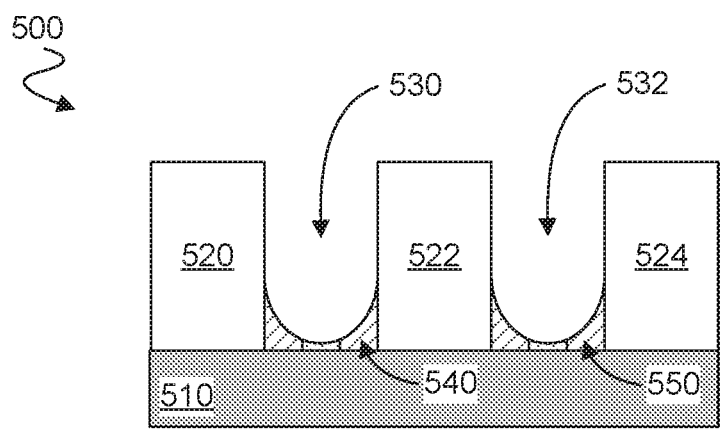
FIGS. 5A, 5B illustrate cross-sectional views of various operations in a method of patterning using lined resist photobucket structures in accordance with another embodiment.
Figure 5A:
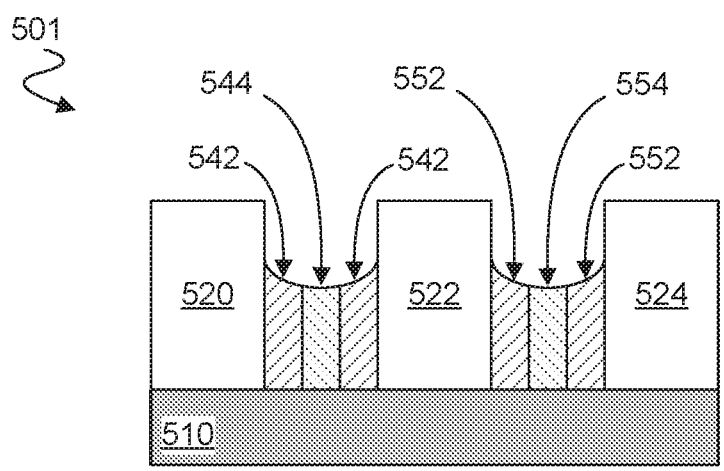
Figure 5A:
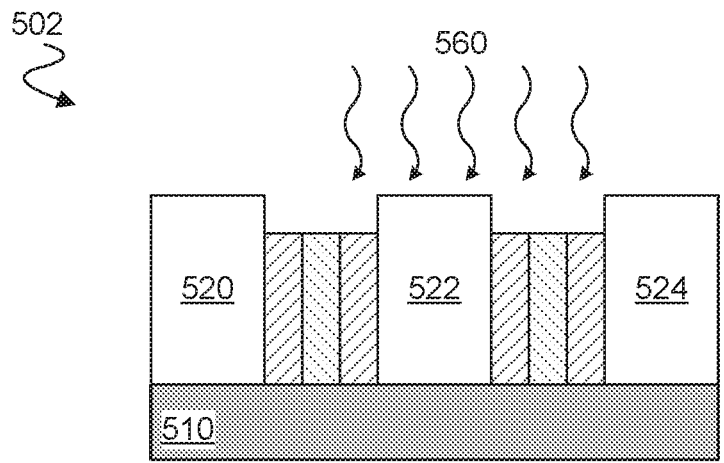
Figure 5B:
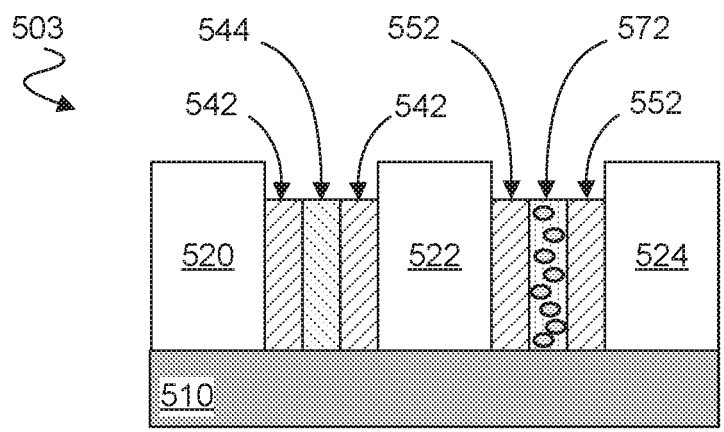
Figure 5B:
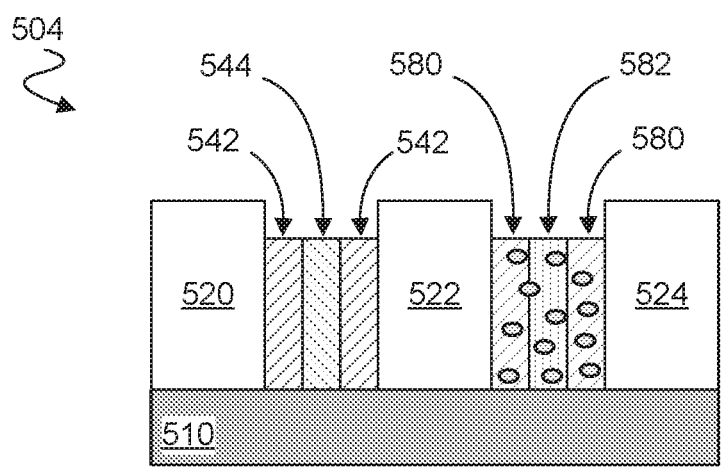
Figure 5B:
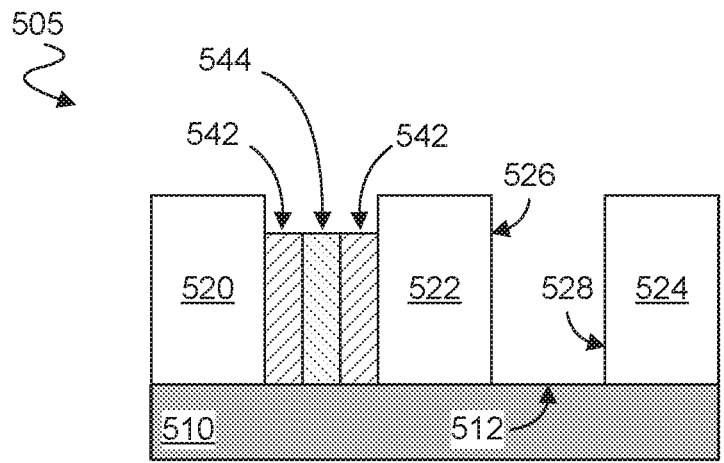

FIGS. 5A and 5B illustrate stages 500-505 of processing to provide patterned photoresist structures according to an embodiment. Processing such as that represented by stages 500-505 may include some or all of the processing represented by stages 100-102, for example. In some embodiments, the processing represented by stages 500-505 is according to method 300.

Referring to stage 500, a pre-patterned hard mask is disposed on a substrate 510. The pre-patterned hard mask has formed therein recesses (such as the illustrative recesses 530, 532) that extend through to substrate 510. Structures 520, 522, 524 of the hard mask define respective sidewalls of recesses 530, 532. In an embodiment, self-assembly is performed to variously form respective liner structures and photobuckets in recesses 530, 532. By way of illustration and not limitation, a photoresist-based BCP (block-copolymer) 540 may be deposited for self-assembly in recess 530, where photoresist-based. BCP 550 is similarly deposited into recess 532. BCPs 540, 550 may be designed, for example, to form lamellar, cylinder, spherical or other nanostructures of a photo bucket. In an embodiment, BCPs 540, 550 variously include respective photoresist groups/domains and liner groups/domains—e.g., wherein photoresist groups/domains are configured to segregate toward hard mask surfaces and liner groups/domains are configured to segregate away from such hard mask surfaces.

Stage 501 shows structures of stage 500 after further self-assembly of BCP 540 results in the formation of a photobucket 544 that is surrounded or otherwise adjoined by a liner 542. Alternatively or in addition, further self-assembly of BCP 550 may result in the formation of a photobucket 554 that is surrounded or otherwise adjoined by a liner 552. Subsequently, one or more photobuckets—e.g., including only one of photobuckets 544, 554—may be selectively exposed to photons or an electron beam to facilitate removal from the hard mask recesses.

Referring to stage 502, an illustrative scenario is shown wherein UV light 560 is to be directed into recess 532 (but, at least ideally, not into recess 530). In practice, misalignment may result in UV light 560 being offset in a direction toward recess 530. Liner 542 may provide protection for some or all of such offset. Referring to stage 503, an exposed photoresist material 572 of photobucket 554 may generate a photoacid in response to UV light 560. As illustrated at stage 504, such a photoacid may diffuse into liner 552, resulting in an at least partially dissolved liner material 580 around the deacidified photoresist material 582 of liner 552. The exposed and deacidified photoresist material 582 and the at least partially dissolved liner material 580 may be subsequently removed from recess 532 by wet etch, dry etch and/or other subtractive processing. As shown at stage 505, such removal may expose respective sidewalls 526, 528 of mask structures 522, 524 and further expose a surface portion 512 of substrate 510.

Figure 6A:
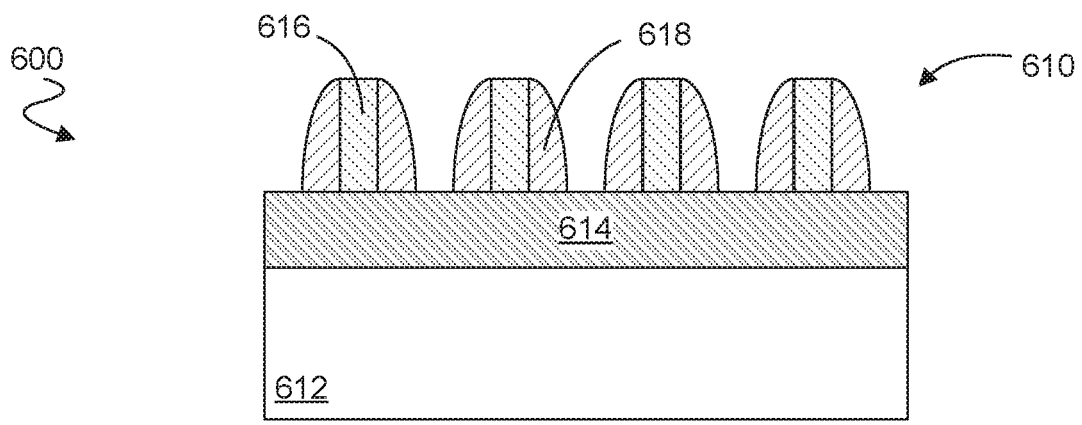
FIGS. 6A-6C illustrate portions of integrated circuit layers representing various operations in a method of subtractive via patterning using lined resist photobucket structures, in accordance with an embodiment.
Figure 6A:
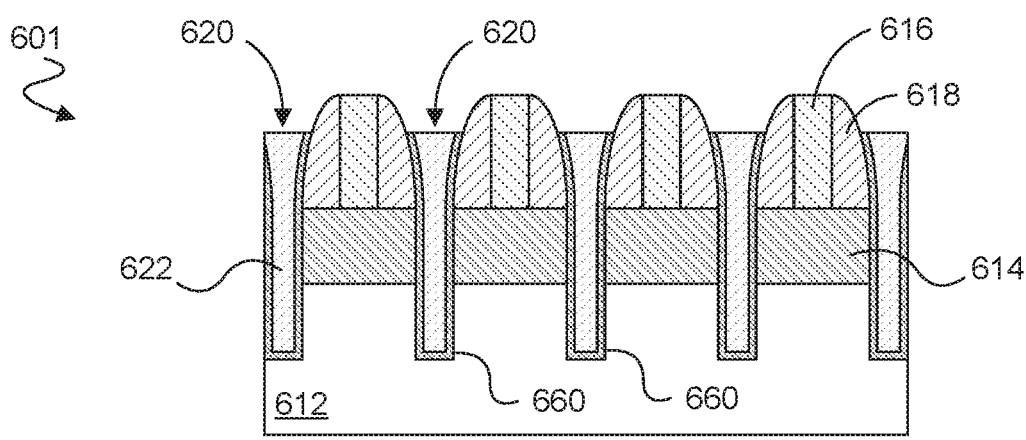
Figure 6A:
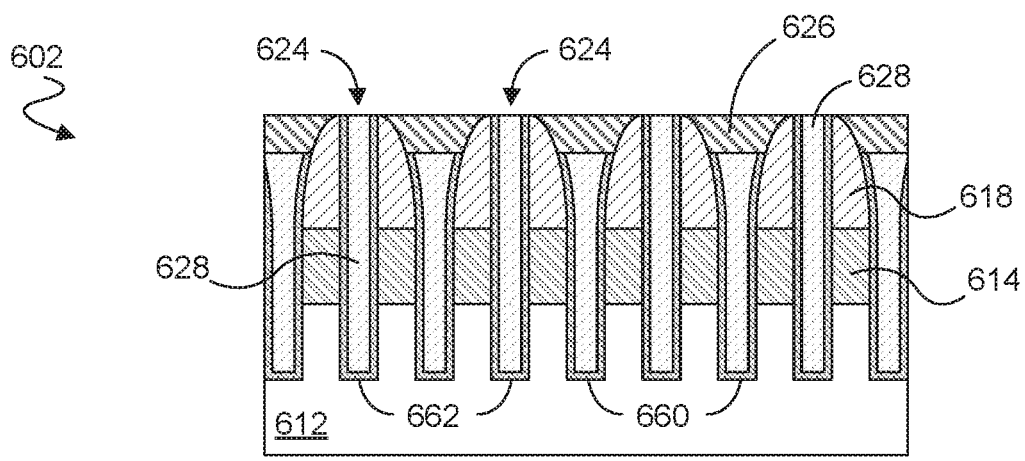
Figure 6B:
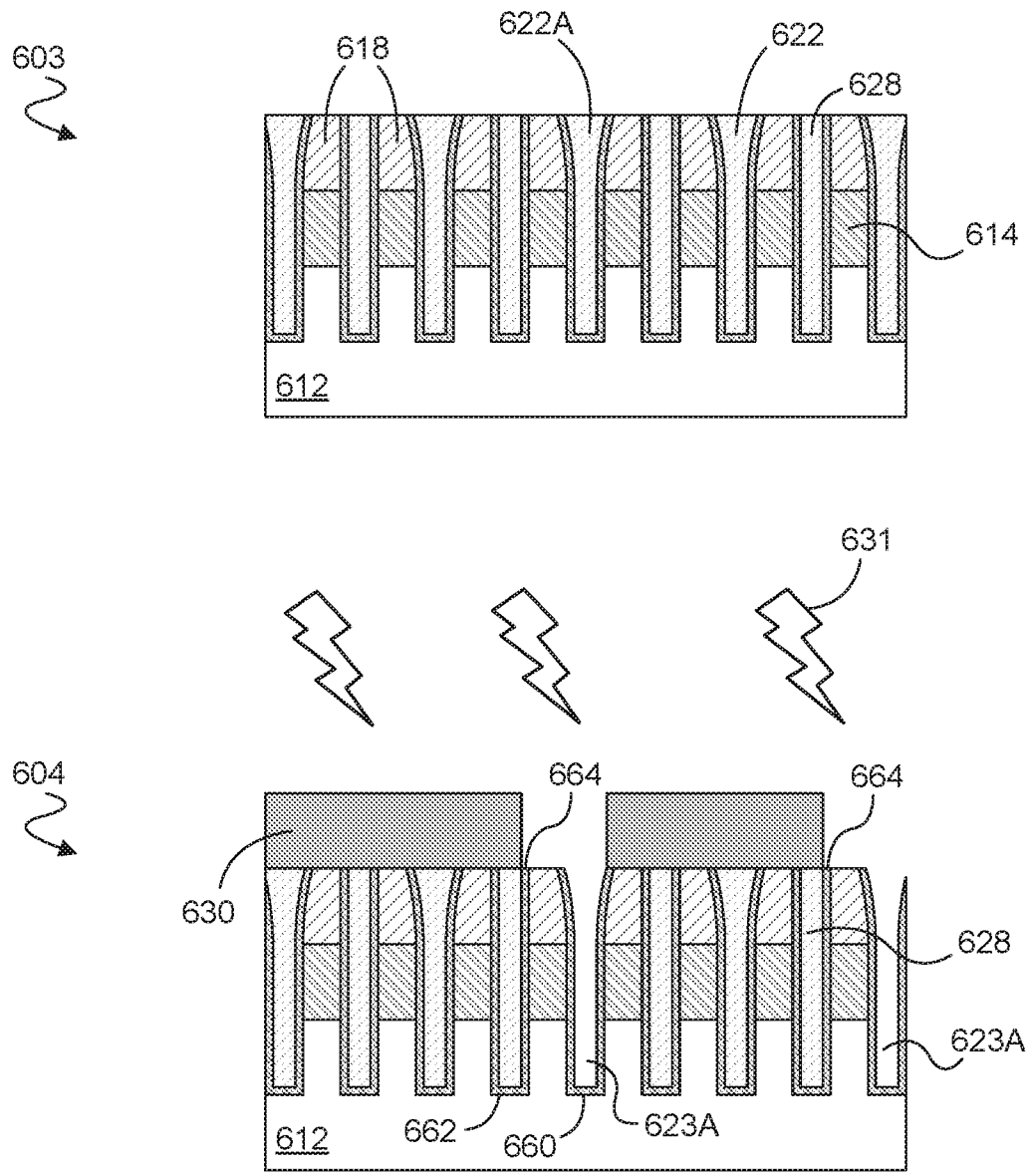
Figure 6C:
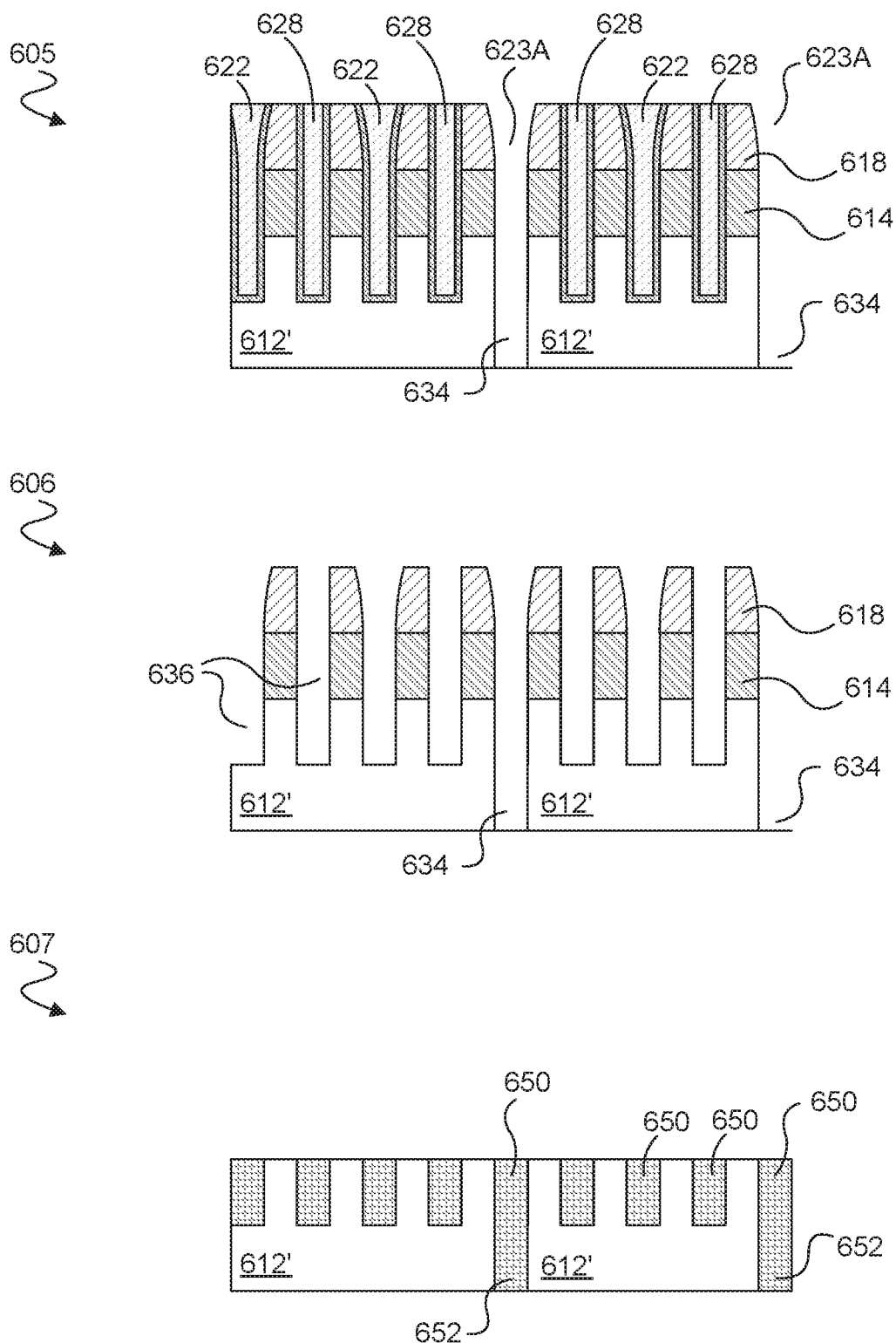

In one aspect, a self-aligned via opening approach is used. As an example, FIGS. 6A-6C, illustrate portions of integrated circuit layers representing various stages 600-607 in a method of subtractive via patterning using photobuckets including liner structures, in accordance with an embodiment. In each illustration at each described operation, cross-sectional views are shown.

Stage 600 illustrates a cross-sectional view of a starting structure 610 following deposition, but prior to patterning, of a first hardmask material layer 614 formed on an inter-layer dielectric (ILD) layer 612, in accordance with an embodiment. Referring to stage 600, a patterned mask 616 has spacers 618 formed along sidewalls thereof, on or above the first hardmask material layer 614.

Stage 601 illustrates the structure of stage 600 following first time patterning of the first hardmask layer and subsequent first photobucket fill, in accordance with an embodiment. Referring to stage 601, the patterned mask 616 and corresponding spacers 618 are used together as a mask during an etch to form recesses 620 through the first hardmask material layer 614 and partially into the ILD layer 612. The recesses 620 are then filled with first photobuckets 622 and liner structure 660.

Stage 602 illustrates the structure of stage 601 following second time patterning of the first hardmask layer and subsequent second photobucket fill, in accordance with an embodiment. Referring to stage 602, the patterned mask 616 is removed and a second plurality of recesses 624 is etched through the first hardmask material layer 614 and partially into the ILD layer 612, between spacers 618. Subsequently, the recesses 624 are filled with second liner structures 662 and photobuckets 628—e.g., using a patterned mask 626. In one such embodiment, the second photobuckets 628 and the first photobuckets 622 are filled with a same photoresist material.

Referring again to stage 602, the negative pattern of the spacers 618 is thus transferred, e.g., by two etch processes forming recesses 620 and 624, to the first hardmask material layer 614. In one such embodiment, the spacers 618 and, hence, the recesses 620 and 624 are formed with a grating pattern, as is depicted in stage 602. In an embodiment, the grating pattern is a tight pitch grating pattern. In a specific such embodiment, the tight pitch is not achievable directly through conventional lithography. For example, a pattern based on conventional lithography may first be limited to mask 616, but the pitch may be halved by the use of negative spacer mask patterning, as is depicted in stages 600-602. Even further, although not shown, the original pitch may be quartered by a second round of spacer mask patterning. Accordingly, the grating-like pattern of the first photobuckets 622 and second photobuckets 628, collectively, may be spaced at a constant pitch and may have a constant width.

Stage 603 illustrates the structure of stage 602 following planarization to isolate the first and second photobuckets 622, 628 from one another, in accordance with an embodiment. Referring to stage 603, the second photobuckets 628 and the top portions of the spacers 618 are planarized, e.g., by chemical mechanical polishing (CMP), until the top surfaces of the first photobuckets 622 are exposed, forming discrete second photobuckets 628. In one embodiment, the combination of first photobuckets 622 and second photobuckets 628 represent all possible via locations in a subsequently formed metallization structure. One of the first photobuckets 622 is labeled as 622A to indicate that it is selected from removal for ultimate via fabrication.

Stage 604 illustrates the structure of stage 603 following exposure and development of two photobuckets to leave selected via locations, in accordance with an embodiment. Referring to stage 604, a second hardmask 630 is formed and patterned on the structure of stage 603. The patterned second hardmask 630 reveals two of the first photobuckets 622. The selected photobuckets are exposed to light irradiation, such as an EUV or e-beam exposure 631. It is to be appreciated that description herein concerning forming and patterning a hardmask layer involves, in an embodiment, mask formation above a blanket hardmask layer. The mask formation may involve use of one or more layers suitable for lithographic processing. Upon patterning the one or more lithographic layers, the pattern is transferred to the hardmask layer by an etch process to provide a patterned hardmask layer.

In an illustrative scenario with one embodiment, referring again to stage 604, a neighboring one of the second photobuckets 628 may be partially exposed, e.g., due to misalignment in the patterning of second hardmask 630. In particular, two of the second photobuckets 628 may be inadvertently exposed at regions 664, even though they have not been selected as locations for via fabrication. Thus, the selected ones of the first photobuckets 622 are exposed to the EUV or e-beam radiation to a greater extent than the neighboring partially, exposed ones of the second photobuckets 628. However, various embodiments may reduce a possibility that region 664 include any of second photobuckets 628. For example, region 660 may be more predominantly or entirely surface regions of liner structures 662.

Referring again to stage 604, the photobuckets are subjected to a develop process. During the develop process, the select one of the first photobuckets 622 targeted for via fabrication are emptied in that the photoresist is removable. However, locations not selected for via fabrication, including the ones of the second photobuckets 628 that may have been partially exposed at regions 664, are not opened during the develop process, in that the resist material is not removable in the develop process. The developing provides selected via openings 623A.

Stage 605 illustrates the structure of stage 604 following etching to form via locations, in accordance with an embodiment. Referring to stage 605, the pattern of the via openings 623A are subjected to a selective processing—e.g., including a wet etch (acid or base, in various embodiments), plasma etch or dry etch—to remove the respective liner structures 660 under openings 623A. Such etching (or additional etching) may further selectively process openings 623A to extend the via openings deeper into the underlying ILD layer 612, forming via patterned ILD layer 612' with via locations 634. The etching is selective to remaining photobuckets and to the spacers 618.

Stage 606 illustrates the structure of stage 605 in preparation for metal fill, in accordance with an embodiment. Referring to stage 606, all remaining photoresist materials and liner structures of the first and second photobuckets 622, 628 are removed. The remaining materials/structures of the first and second photobuckets 622, 628 may be removed directly, or may first be exposed and developed to enable removal. The removal of the remaining materials of the first and second photobuckets 622, 628 provides metal line recesses 636, some of which are coupled to via locations 634 in patterned ILD layer 612'.

Referring to stage 607, subsequent processing can include removal of spacers 618 and hardmask layer 614, and metal fill of metal line recesses 636 and via locations 634 to form conductive metal lines 650 and conductive vias 652, respectively. In one such embodiment, metallization is formed by a metal fill and polish back process. The structure of stage 607 may subsequently be used as a foundation for forming subsequent metal line/via and ILD layers. Alternatively, the structure of stage 607 may represent the final metal interconnect layer in an integrated circuit. It is to be appreciated that the above process operations may be practiced in alternative sequences, not every operation need be performed and/or additional process operations may be performed. Referring again to stage 607, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Additionally, it is to be appreciated that the approaches described in association with stages 600-607 are not necessarily performed as forming vias aligned to an underlying metallization layer. As such, in some contexts, these process schemes could be viewed as involving blind shooting in the top down direction with respect to any underlying metallization layers. In a second aspect, a subtractive approach provides alignment with an underlying metallization layer. As an example, FIGS. 7A-7D illustrate portions of integrated circuit layers representing various operations in a method of subtractive via patterning using lined photobuckets, in accordance with another embodiment. In each illustration at each described operation, an angled three-dimensional cross-section view is provided.

Figure 7A:
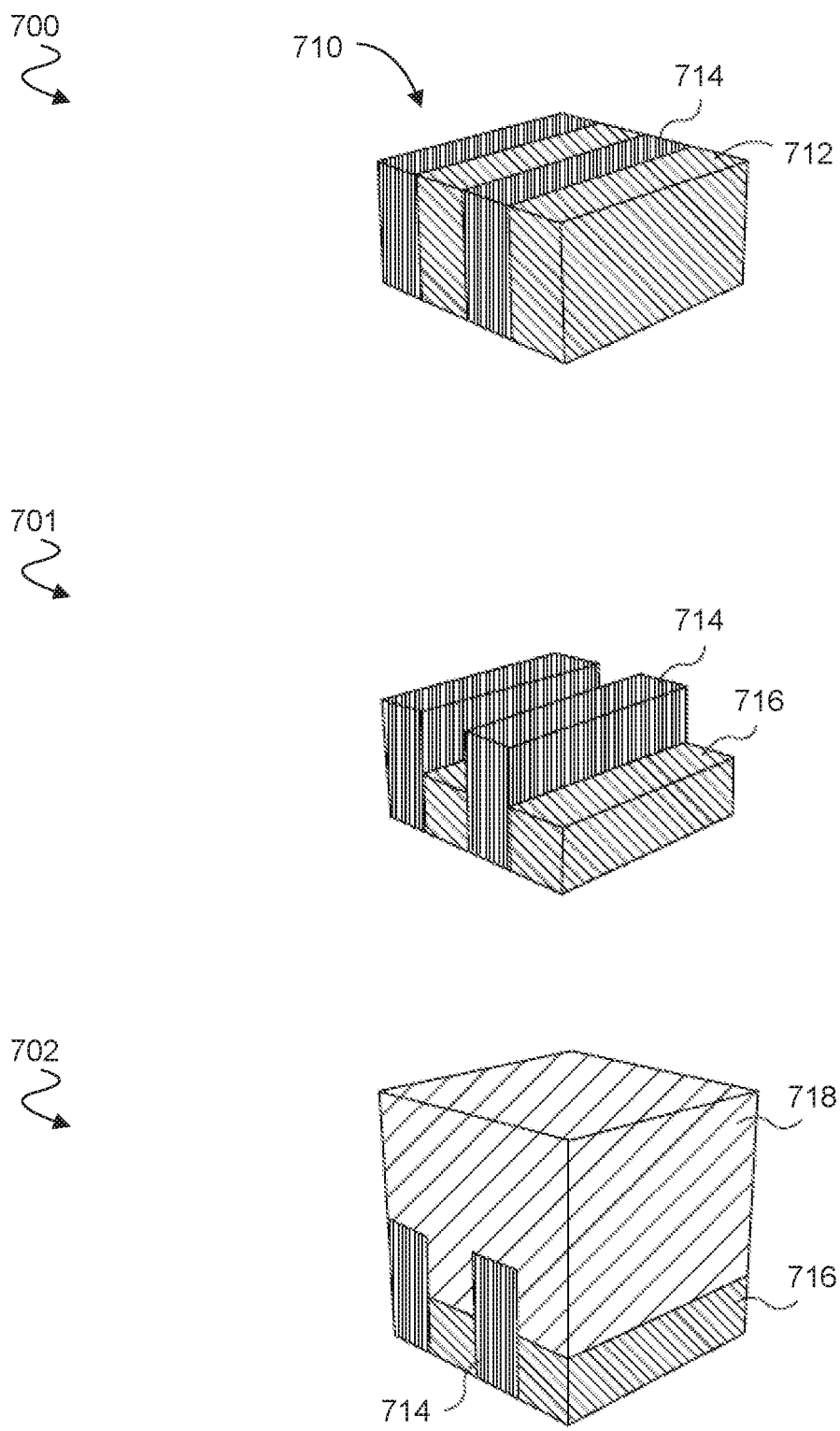
FIGS. 7A-7D illustrate portions of integrated circuit layers representing various operations in a method of subtractive via patterning using lined resist photobucket structures, in accordance with an embodiment.

Stage 700 of FIG. 7A illustrates a structure 710 for a subtractive via process following deep metal line fabrication, in accordance with an embodiment. Referring to stage 700, structure 710 includes metal lines 712 with intervening interlayer dielectric (ILD) lines 714. It is to be appreciated that some of the lines 712 may be associated with underlying vias for coupling to a previous interconnect layer. In an embodiment, the metal lines 712 are formed by patterning trenches into an ILD material (e.g., the ILD material of lines 714). The trenches are then filled by metal and, if needed, planarized to the top of the ILD lines 714. In an embodiment, the metal trench and fill process involves high aspect ratio features. For example, in one embodiment, the aspect ratio of metal line height (h) to metal line width (w) is approximately in the range of 5-10.

Stage 701 illustrates the structure of stage 700 following recessing of the metal lines, in accordance with an embodiment. Referring to stage 701, the metal lines 712 are recessed selectively to provide first level metal lines 716. The recessing is performed selectively to the ILD lines 714. The recessing may be performed by etching through dry etch, wet etch, or a combination thereof. The extent of recessing may be determined by the targeted thickness of the first level metal lines 716 for use as suitable conductive interconnect lines within a back end of line (BEOL) interconnect structure.

Stage 702 illustrates the structure of stage 701 following formation of an inter layer dielectric (ILD) layer, in accordance with an embodiment. Referring to stage 702, an ILD material layer 718 is deposited and, if necessary, planarized, to a level above the recessed metal lines 716 and the ILD lines 714.

Figure 7B:
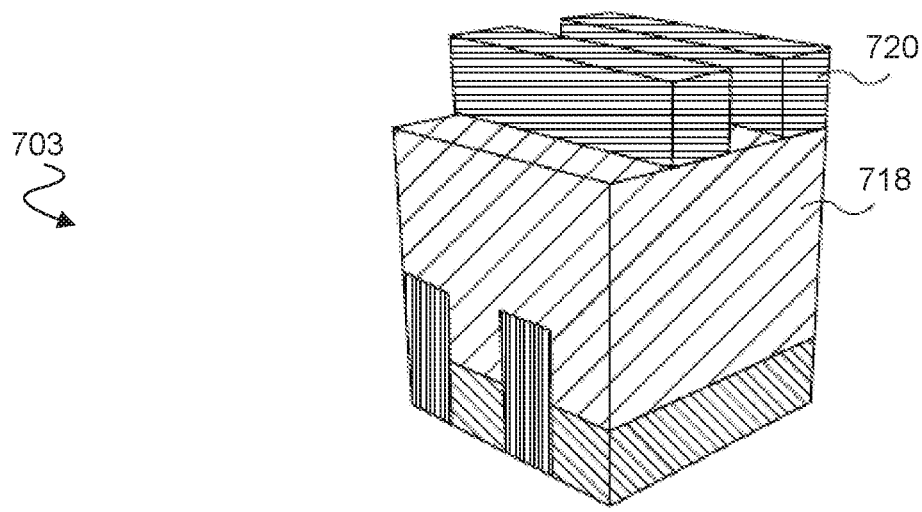
Figure 7B:
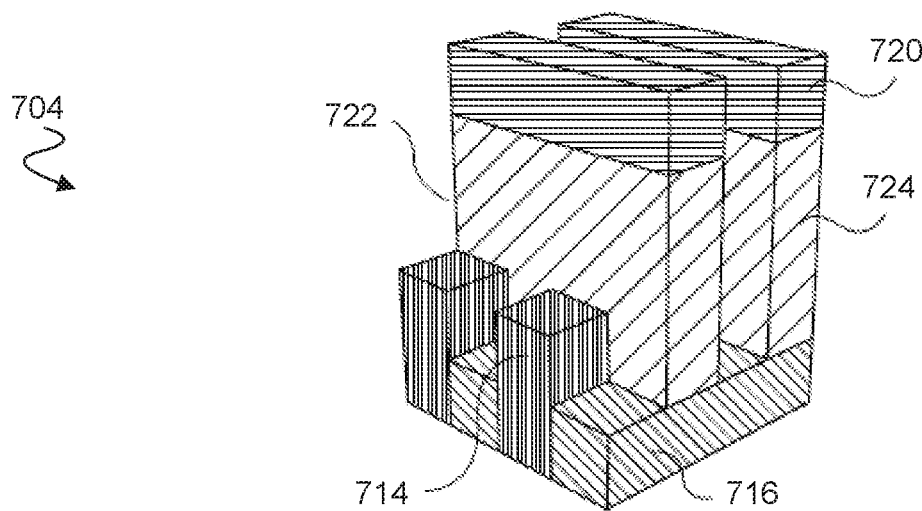

Stage 703 of FIG. 7B illustrates the structure of stage 702 following deposition and patterning of a hardmask layer, in accordance with an embodiment. Referring to stage 703 a hardmask layer 720 is formed on the ILD layer 718. In one such embodiment, the hardmask layer 720 is formed with a grating pattern orthogonal to the grating pattern of the first level metal lines 716/ILD lines 714, as is depicted in stage 703. In an embodiment, the grating structure formed by the hardmask layer 720 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 720 of stage 703 may have hardmask lines spaced at a constant pitch and having a constant width.

Stage 704 illustrates the structure of stage 703 following trench formation defined using the pattern of the hardmask of stage 703, in accordance with an embodiment. Referring to stage 704, the exposed regions (i.e., unprotected by 720) of the ILD layer 718 are etched to form trenches 722 and patterned ILD layer 724. The etch stops on, and thus exposes, the top surfaces of the first level metal lines 716 and the ILD lines 714.

Figure 7C:
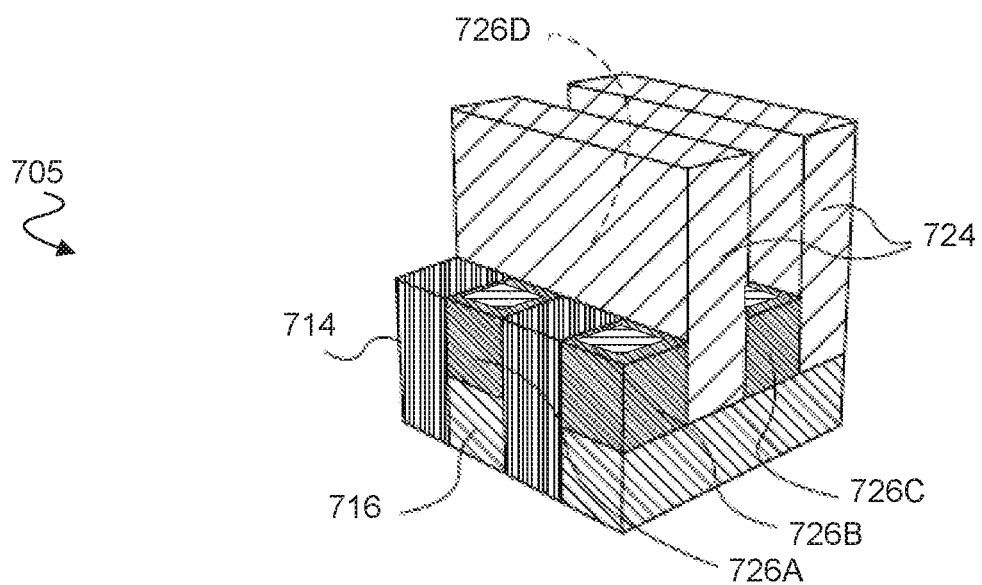
Figure 7C:
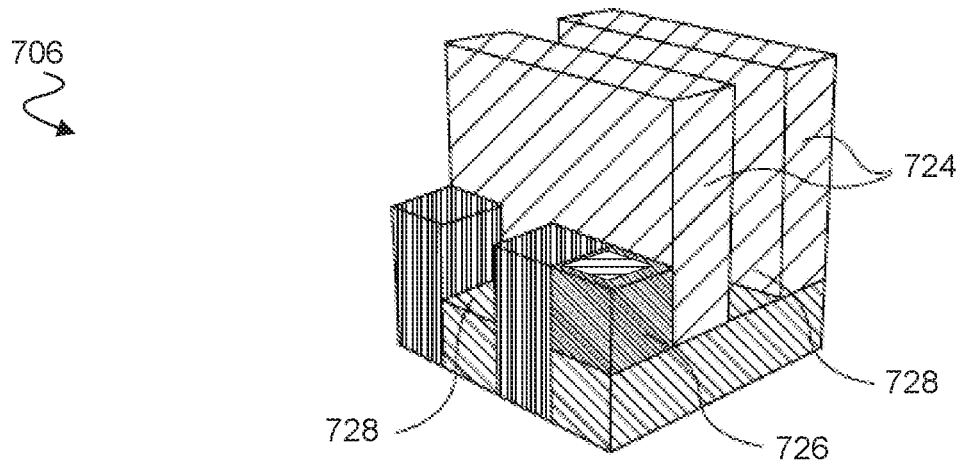

Stage 705 of FIG. 7C illustrates the structure of stage 704 following photobucket formation in all possible via locations, in accordance with an embodiment. Referring to stage 705, photobuckets 726 are formed in all possible via locations above exposed portions of the recessed metal lines 716. In one embodiment, the photobuckets 726 are formed essentially co-planar with the top surfaces of the ILD lines 714, as depicted in stage 705. Additionally, referring again to stage 705, the hardmask layer 720 may be removed from the patterned ILD layer 724.

Referring again to stage 705, in an embodiment, the photobuckets 726 each have formed therein a respective liner structure and a resist material disposed therein, examples of which are described herein. Three different possible via locations 726A, 726B and 726C can be seen in the view provided in stage 705 (where another possible via location 726D is hidden by the patterned ILD layer 724).

Stage 706 illustrates the structure of stage 705 following via location selection, in accordance with an embodiment. Referring to stage 706, the photobuckets 726 from stage 705 in select via locations 728 are removed (i.e., photobuckets 726A and 726C are removed). In locations where vias are not selected to be formed, the photobuckets 316 are retained (i.e., photobucket 726B remains after the development process). In one embodiment, photobucket 726B is partially exposed during exposure of photobuckets 726A and 726C. However, as described herein, since the photobucket 726B is only partially exposed and is not a select via location— e.g., wherein liner material of photobucket 726B is exposed, but not any resist material surrounded by such liner material—retention of all of photobucket 726B may be achieved according to some embodiments.

Figure 7D:
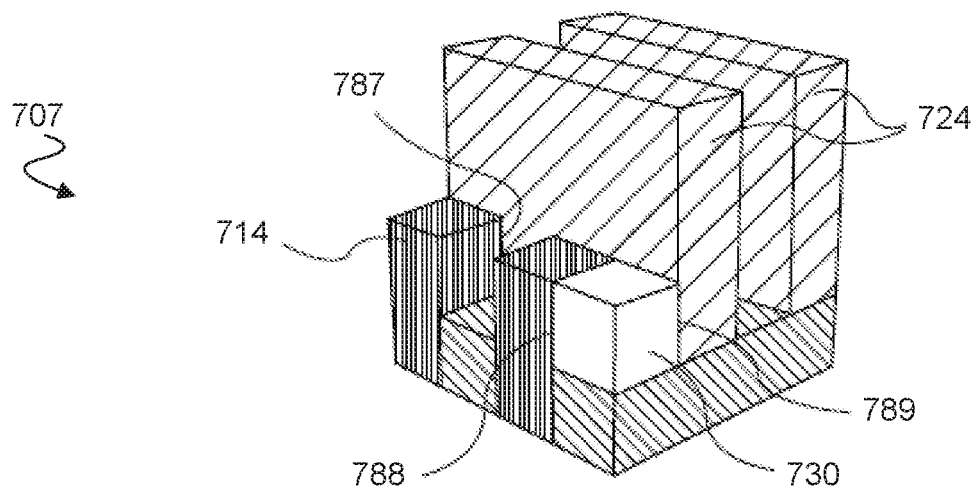
Figure 7D:
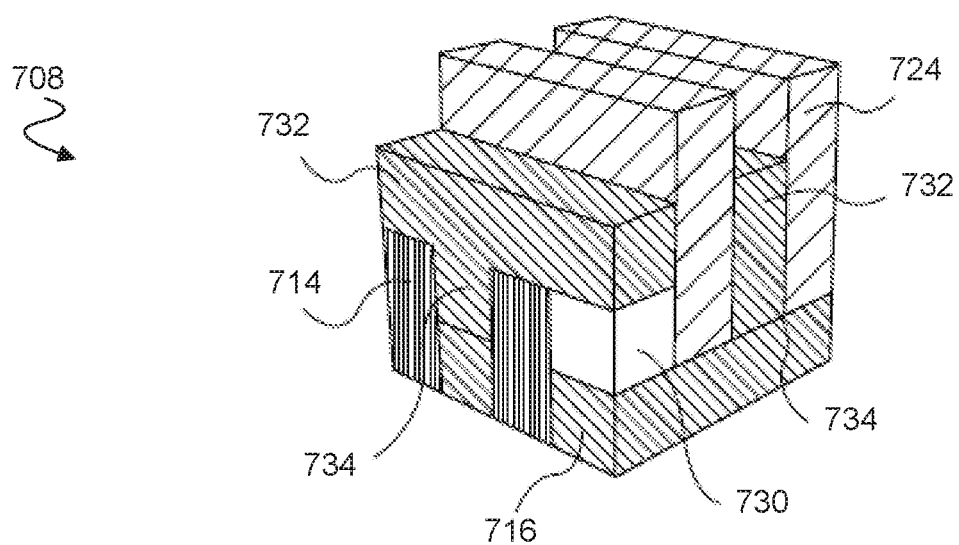

Stage 707 of FIG. 7D illustrates the structure of stage 706 following conversion of the remaining photobuckets to permanent ILD material, in accordance with an embodiment. Referring to stage 707, the material of the photobuckets 726 is modified, e.g., by cross-linking upon a baking operation, in the locations to form a final material 730. In one such embodiment, the cross-linking provides for a solubility switch upon the baking. The final, cross-linked material has inter-dielectric properties and, thus, can be retained in a final metallization structure. However, in other embodiments, the photobucket material of photobucket 726B is not converted to an ILD material and is instead ultimately removed and replaced with a permanent ILD material.

Referring again to stage 707, in an embodiment, the resulting structure includes up to three different dielectric material regions (ILD lines 714+ILD lines 724+cross-linked photobucket 730, in one embodiment) in a single plane 750 of the metallization structure. In one such embodiment, two or all of ILD lines 714, ILD lines 724, and cross-linked photobucket 730 are composed of a same material. In another such embodiment, ILD lines 714, ILD lines 724, and cross-linked photobucket 730 are all composed of different ILD materials. In either case, in a specific embodiment, a distinction such as a vertical seam between the materials of ILD lines 714 and ILD lines 724 (e.g., seam 787) and/or between ILD lines 714 and cross-linked photobucket 730 (e.g., seam 788) and/or between ILD lines 724 and cross-linked photobucket 730 (e.g., seam 789) may be observed in the final structure.

Stage 708 illustrates the structure of stage 707 following metal line and via formation, in accordance with an embodiment. Referring to stage 708, metal lines 732 and vias 734 are formed upon metal fill of the openings of stage 707. The metal lines 732 are coupled to the underlying metal lines 716 by the vias 734. In an embodiment, the openings are filled in a damascene approach or a bottom-up fill approach to provide the structure shown in stage 708. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 724 may be removed to provide air gaps between the resulting metal lines 734.

The structure of stage 708 may subsequently be used as a foundation for forming subsequent metal line/via and ILD layers. Alternatively, the structure of stage 708 may represent the final metal interconnect layer in an integrated circuit. It is to be understood that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithograph/dual damascene patterning that must otherwise be tolerated, is not a factor for the resulting structures described herein. Referring again to stage 708, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Overall, in accordance with one or more embodiments of the present invention, approaches described herein involve use of photobucket interlayer dielectric (ILD) to select locations for plugs and vias. The details above regarding FIGS. 6A-6C and 7A-7D focus primarily on photobuckets including liner structures as used for via patterning. However, it is to be appreciated that photobuckets including liner structures may also be used for plug patterning.

In an embodiment, the term "grating structure" for metal lines, ILD lines or hardmask lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described above may have metal lines, ILD lines or hardmask lines spaced at a constant pitch and having a constant width. The pattern may be fabricated by a pitch halving or pitch quartering approach.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material (e.g., metal lines and/or vias) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, plug and/or cap and/or hardmask materials are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers may be formed by CVD, PVD, or by other deposition methods.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
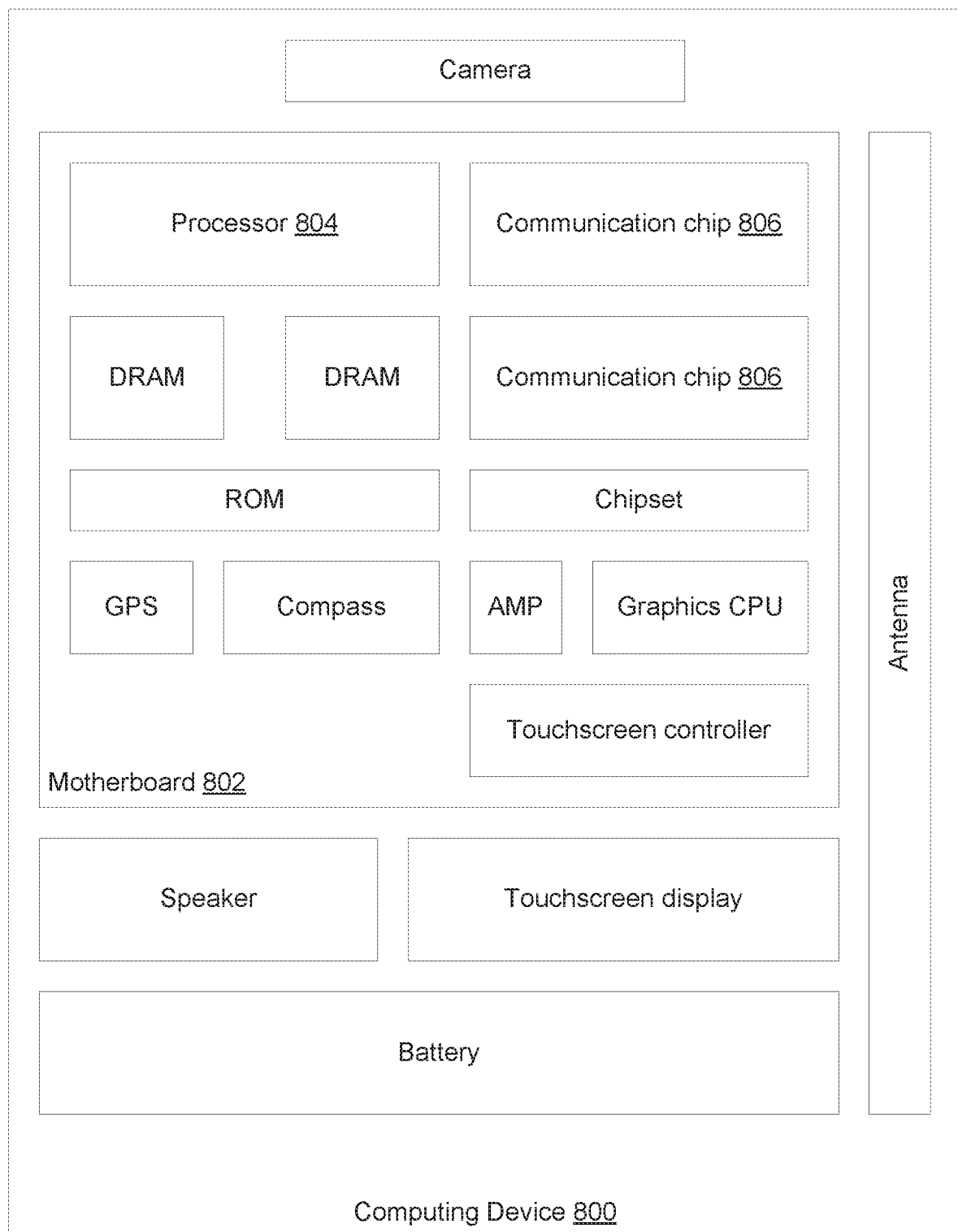
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LIE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more structures, such as self-aligned vias, built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip 806 includes one or more structures, such as conductive vias fabricated using lined photobucket structures, in accordance with any of various embodiments.

In further implementations, another component housed within the computing device 800 may contain an integrated circuit die that includes one or more structures, such as conductive vias fabricated using a lined photobucket structures, in accordance with embodiments of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
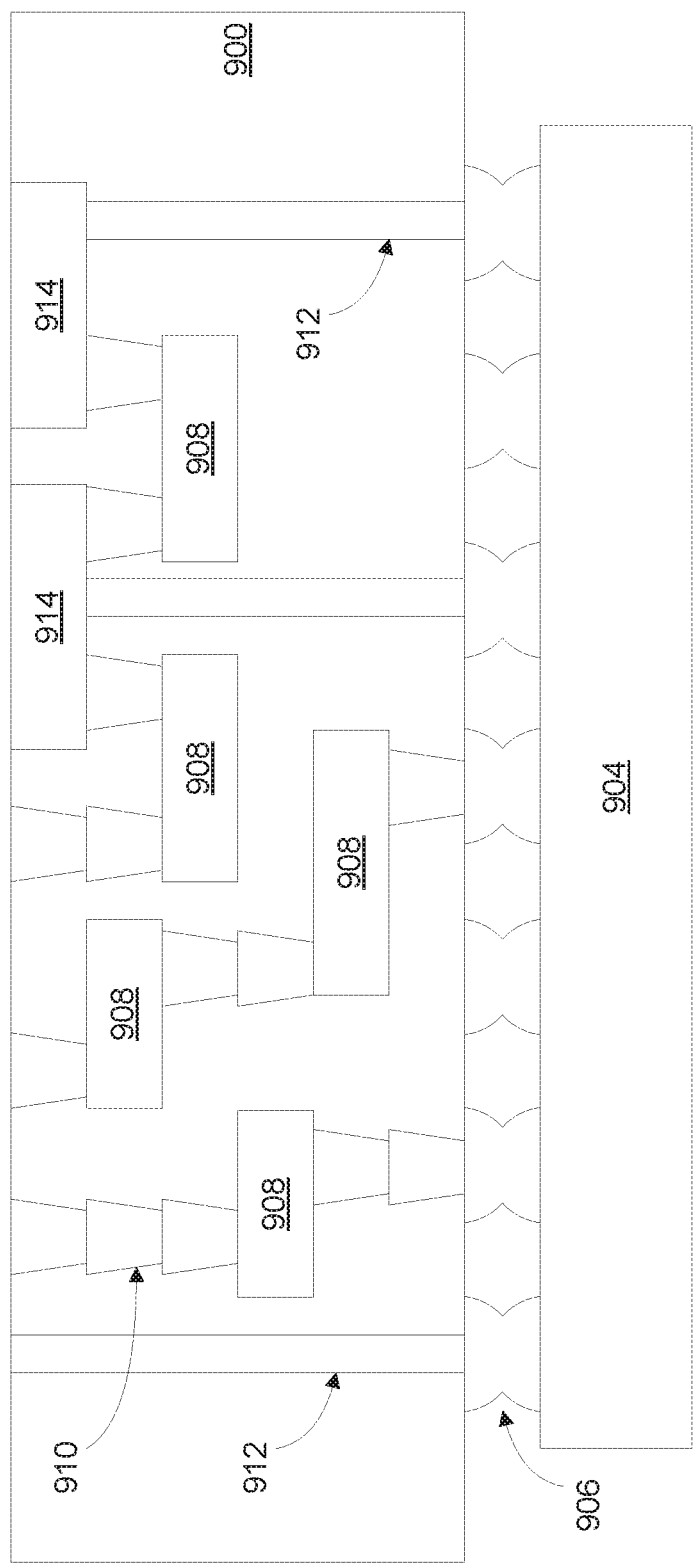
FIG. 9 is an interposer implementing one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900 or in one or more of the components of the interposer 900.

In another implementation, a method comprises forming a plurality of recesses in a mask layer disposed on an interlayer dielectric material layer, and for each of the plurality of recesses, forming a respective liner structure in the recess, wherein a thickness of a sidewall of the liner structure is at least 0.8 nanometers (nm), and forming a respective photobucket in the recess, wherein the photobucket is surrounded by the liner structure in the recess. The method further comprises selectively removing respective photobuckets from only a subset of the plurality of recesses using a lithographic exposure.

In one embodiment, for a first recess of the plurality of recesses, forming the respective liner structure in the first recess includes deposing a metal oxide or a metal nitride. In another embodiment, for a first recess of the plurality of recesses, forming the respective liner structure in the first recess and forming the respective photobucket in the first recess includes performing a self-assembly of a polymer. In another embodiment, a thickness of a first liner structure in a first recess is at least 1.0 nm. In another embodiment, the thickness of the first liner structure is at least 1.5 nm.

In another embodiment, a thickness of a first liner structure in a first recess is in a range of 0.8 nm to 2.5 nm. In another embodiment, the thickness of the first liner structure is in a range of 1.0 nm to 2.5 nm. In another embodiment, the thickness of the first liner structure is in a range of 1.5 nm to 2.5 nm. In another embodiment, a thickness of a first liner structure in a first recess is at least 5% of a thickness of a first photobucket in the first recess. In another embodiment, the thickness of the first liner structure at least 10% of the thickness of the first photobucket. In another embodiment, the thickness of the first liner structure at least 15% of the thickness of the first photobucket. In another embodiment, the method further comprises removing liner structures each from a respective recess of the subset of the plurality of recesses. In another embodiment, the removing the liner structures includes removing using a plasma etch.

In another implementation, a non-transitory computer-readable storage medium has stored thereon instructions which, when executed by one or more processing units, cause the one or more processing units to perform a method comprising forming a plurality of recesses in a mask layer disposed on an interlayer dielectric material layer, and for each of the plurality of recesses, forming a respective liner structure in the recess, wherein a thickness of a sidewall of the liner structure is at least 0.8 nanometers (nm), and forming a respective photobucket in the recess, wherein the photobucket is surrounded by the liner structure in the recess. The method further comprises selectively removing respective photobuckets from only a subset of the plurality of recesses using a lithographic exposure.

In one embodiment, for a first recess of the plurality of recesses, forming the respective liner structure in the first recess includes deposing a metal oxide or a metal nitride. In another embodiment, for a first recess of the plurality of recesses, forming the respective liner structure in the first recess and forming the respective photobucket in the first recess includes performing a self-assembly of a polymer. In another embodiment, a thickness of a first liner structure in a first recess is at least 1.0 nm. In another embodiment, the thickness of the first liner structure is at least 1.5 nm.

In another embodiment, a thickness of a first liner structure in a first recess is in a range of 0.8 nm to 2.5 nm. In another embodiment, the thickness of the first liner structure is in a range of 1.0 nm to 2.5 nm. In another embodiment, the thickness of the first liner structure is in a range of 1.5 nm to 2.5 nm. In another embodiment, a thickness of a first liner structure in a first recess is at least 5% of a thickness of a first photobucket in the first recess. In another embodiment, the thickness of the first liner structure at least 10% of the thickness of the first photobucket. In another embodiment, the thickness of the first liner structure at least 15% of the thickness of the first photobucket. In another embodiment, the method further comprises removing liner structures each from a respective recess of the subset of the plurality of recesses. In another embodiment, the removing the liner structures includes removing using a plasma etch.

In another implementation, a device comprises an interlayer dielectric material layer, a mask layer disposed on the interlayer dielectric material layer, the mask layer having formed therein a first plurality of recesses and a second plurality of recesses. The device further comprises, for each of the first plurality of recesses, a respective liner structure disposed in the recess, wherein a thickness of a sidewall of the liner structure is at least 0.8 nanometers (nm), and a respective photobucket disposed in the recesses, wherein the photobucket is surrounded by the liner structure disposed in the recess.

In one embodiment, for a first recess of the plurality of recesses, the respective liner structure in the first recess includes a metal oxide or a metal nitride. In another embodiment, for a first recess of the plurality of recesses, the respective liner structure in the first recess and the respective photobucket in the first recess includes a self-assembled polymer structure. In another embodiment, a thickness of a first liner structure in a first recess is at least 1.0 nm. In another embodiment, the thickness of the first liner structure is at least 1.5 nm. In another embodiment, a thickness of a first liner structure in a first recess is in a range of 0.8 nm to 2.5 nm. In another embodiment, the thickness of the first liner structure is in a range of 1.0 nm to 2.5 nm. In another embodiment, the thickness of the first liner structure is in a range of 1.5 nm to 2.5 nm. In another embodiment, a thickness of a first liner structure in a first recess is at least 5% of a thickness of a first photobucket in the first recess. In another embodiment, the thickness of the first liner structure at least 10% of the thickness of the first photobucket. In another embodiment, the thickness of the first liner structure at least 15% of the thickness of the first photobucket.

What is claimed is:

1. A method comprising:
   forming a plurality of recesses in a mask layer disposed on an interlayer dielectric material layer;
   for each recess of the plurality of recesses:
     forming a respective liner structure in the recess; and
     forming a respective photobucket in the recess, wherein the photobucket is surrounded by the liner structure in the recess; and
   selectively removing respective photobuckets from only a subset of the plurality of recesses using a lithographic exposure.

2. The method of claim 1, wherein, for a first recess of the plurality of recesses, forming the respective liner structure in the first recess includes deposing a metal oxide or a metal nitride.

3. The method of claim 1, wherein, for a first recess of the plurality of recesses, forming the respective liner structure in the first recess and forming the respective photobucket in the first recess includes performing a self-assembly of a polymer.

4. The method of claim 1, wherein a thickness of a first liner structure in a first recess is at least 1.0 nm.

5. The method of claim 4, wherein the thickness of the first liner structure is at least 1.5 nm.

6. The method of claim 1, wherein a thickness of a first liner structure in a first recess is in a range of 0.8 nm to 2.5 nm.

7. The method of claim 6, wherein the thickness of the first liner structure is in a range of 1.0 nm to 2.5 nm.

8. The method of claim 7, wherein the thickness of the first liner structure is in a range of 1.5 nm to 2.5 nm.

9. The method of claim 1, wherein a thickness of a first liner structure in a first recess is at least 5% of a thickness of a first photobucket in the first recess.

10. The method of claim 9, wherein the thickness of the first liner structure at least 10% of the thickness of the first photobucket.

11. The method of claim 10, wherein the thickness of the first liner structure at least 15% of the thickness of the first photobucket.

12. The method of claim 1, further comprising removing the liner structures from the subset of the plurality of recesses.

13. The method of claim 12, the removing the liner structures including removing using a plasma etch.

14. A non-transitory computer-readable storage medium having stored thereon instructions which, when executed by one or more processing units, cause the one or more processing units to perform a method comprising:
forming a plurality of a mask layer disposed on an interlayer dielectric material layer;
for each recess of the plurality of recesses:
forming a respective liner structure in the recess; and
forming a respective photobucket in the recess, wherein the photobucket is surrounded by the liner structure in the recess; and
selectively removing respective photobuckets from only a subset of the plurality of recesses using a lithographic exposure.

15. The computer-readable storage medium of claim 14, wherein, for a first recess of the plurality of recesses, forming the respective liner structure in the first recess includes depositing a metal oxide or a metal nitride.

16. The computer-readable storage medium of claim 14, wherein, for a first recess of the plurality of recesses, forming the respective liner structure in the first recess and forming the respective photobucket in the first recess includes performing a self-assembly of a polymer.

17. The computer-readable storage medium of claim 14, wherein a thickness of a first liner structure in a first recess is in a range of 0.8 nm to 2.5 nm.

18. The computer-readable storage medium of claim 14, wherein a thickness of a first liner structure in a first recess is at least 5% of a thickness of a first photobucket in the first recess.

19. The computer-readable storage medium of claim 14, the method further comprising removing the liner structures from the subset of the plurality of recesses.

* * * * *